US006169437B1

United States Patent
Navarro et al.

(10) Patent No.: US 6,169,437 B1
(45) Date of Patent: Jan. 2, 2001

(54) VARIABLE DELAY MODULE

(75) Inventors: Jesus Antonio Navarro, Chandler; Timothy Jon Klandrud, Phoenix, both of AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/365,390

(22) Filed: Aug. 2, 1999

(51) Int. Cl.[7] .............................. H03D 3/24; H03H 11/26
(52) U.S. Cl. ......................... 327/270; 327/276; 327/158
(58) Field of Search .................................. 327/158, 149, 327/236, 237, 270, 276, 277, 271, 260

(56) References Cited

U.S. PATENT DOCUMENTS

| 5,109,394 | 4/1992 | Hjerpe et al. ........................ 375/119 |
| 5,150,066 | * 9/1992 | Butel et al. ........................... 327/276 |
| 5,604,775 | 2/1997 | Saitoh et al. .......................... 375/376 |
| 5,771,264 | 6/1998 | Lane ...................................... 375/376 |
| 5,859,551 | 1/1999 | Ohishi et al. ......................... 327/159 |
| 5,910,753 | 6/1999 | Bogdan ................................... 331/17 |

FOREIGN PATENT DOCUMENTS

362231508A * 10/1987 (JP) ..................................... 327/276

* cited by examiner

Primary Examiner—Dinh T. Le
(74) Attorney, Agent, or Firm—James E. Klekotka

(57) ABSTRACT

Variable delay module (100) includes a clock generator (110), input A/D converter (120), buffering circuit (190), and output D/A converter (160). Clock generator (110) varies the output sampling rate of output D/A converter (160) relative to the input sampling rate of input A/D converter (120). Variable delay module (100) also uses a linear digital delay buffering circuit (190) to create a continuous delay of an analog signal through the module. Separate clocks (112, 114) are used to control the input and output stages of variable delay module (100). The second clock is asynchronous and continuously varying relative to the first clock. The second clock is generated using the coherent difference between the first clock and an autonomously generated reference phase (time) delay.

19 Claims, 2 Drawing Sheets

VARIABLE DELAY MODULE

FIELD OF THE INVENTION

This invention relates generally to variable delay and, more particularly, to continuously variable delay.

BACKGROUND OF THE INVENTION

Test equipment has been manufactured by a number of vendors for a number of general and special test applications. One such special test application is associated with test equipment designed to perform various simulations. The problems associated with simulation test equipment are numerous, however one problem that has been particularly troublesome is the problem of providing continuously adjustable delay needed to represent the delay associated with a Doppler shift in a communications system.

Some prior art solutions to the problem contained discrete delay jumps, which caused communication links to loose phase lock. In addition, the discrete delay jumps associated with prior art solutions to the problem added noise to simulations. Also, some prior art solutions included a discrete delay circuit that implemented a desired delay using discrete steps, and these nonlinear steps can cause problems with tracking loops.

What is needed is a method and apparatus for providing a continuous phase change in the signal delay, which allows tracking loops to remain locked. Further needed is a method and apparatus for providing continuous delay change to an analog signal.

DETAILED DESCRIPTION OF A PREFERRED EMBODIMENT

The method and apparatus of the invention provides continuous delay changes to an analog signal. The invention provides a more accurate representation of non-geostationary satellite path variations during link simulations. The invention allows phase lock loops used in link simulations to remain locked when delay changes are made.

The method and apparatus of the invention provides continuously controlled clock edges to clock an input A/D converter, an input FIFO, an output FIFO, and an output D/A converter. The preferred embodiment of the invention uses a table driven digital phase lock loop (DPLL) to provide the continuously controlled clock edges.

Commercial test equipment manufacturers can benefit from using a circuit using the present invention to incorporate the delay function into their test equipment, thereby incorporating functionality that is currently unavailable in test equipment simulators. The method and apparatus of the invention provides an emulation of the continuously changing delay between a moving satellite and a ground station or another satellite without discrete time jumps which will cause phase discontinuities in analog signals.

Figure 1:
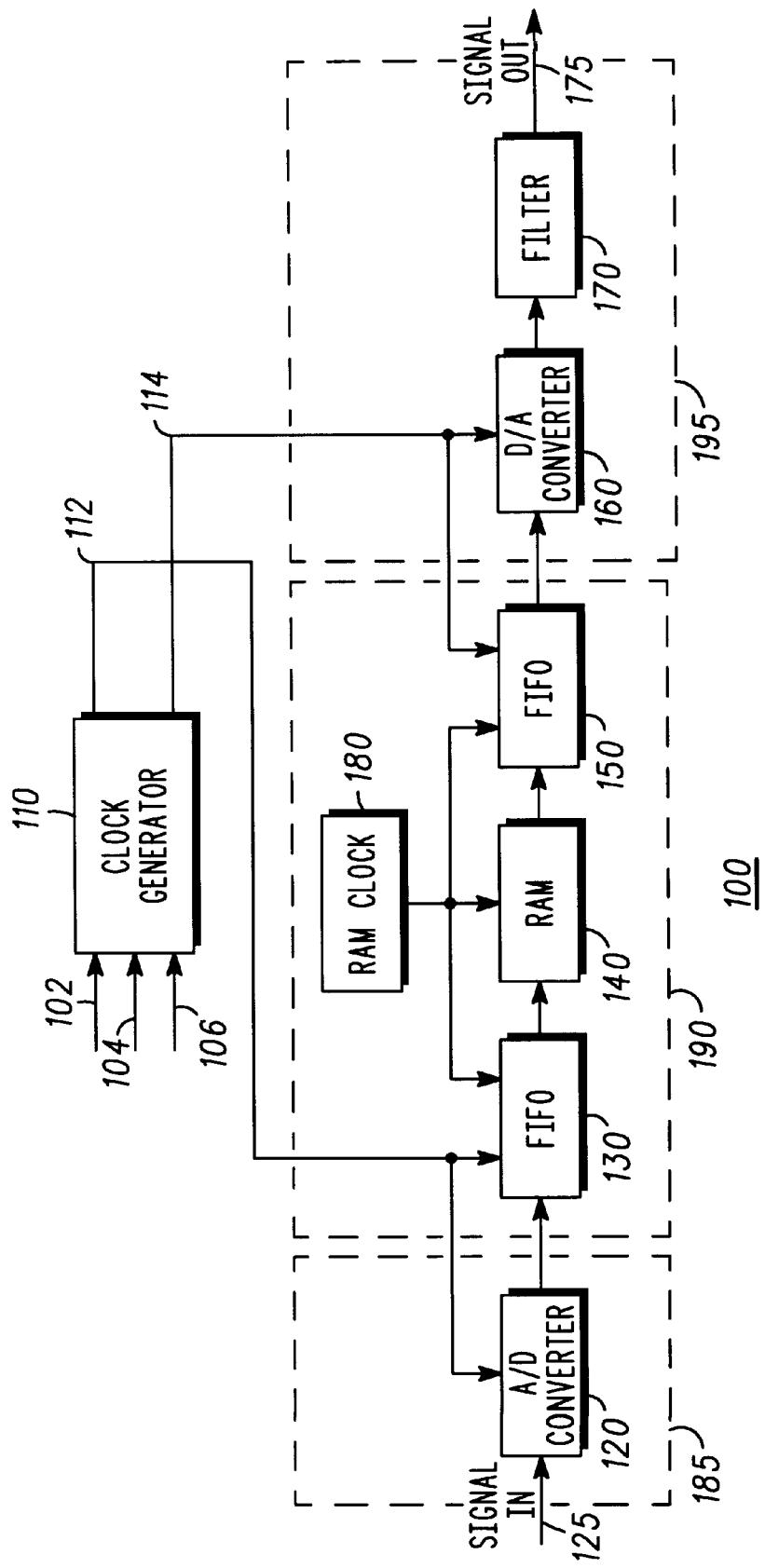
FIG. 1 shows a simplified block diagram of a variable delay module that comprises a clock generator in accordance with a preferred embodiment of the invention.

FIG. 1 shows a simplified block diagram of a variable delay module that comprises a clock generator in accordance with a preferred embodiment of the invention. In a preferred embodiment, variable delay module 100 comprises clock generator 110, input means 185, buffering circuit 190, and output means 195. Clock generator 110 is coupled to input means 185, buffering circuit 190, and output means 195. Input means 185 is coupled to buffering circuit 190. Buffering circuit 190 is coupled to output means 195.

Input means 185 comprises input port 125 and analog-to-digital (A/D) converter 120. In alternate embodiments, input means 185 can comprise one or more filters. Buffering circuit 190 comprises input first-in-first-out (FIFO) circuit 130, RAM 140, RAM clock circuitry 180, and output FIFO circuit 150. Output means comprises 195 digital-to-analog (D/A) converter 160 and output port 175. In addition, output means 195 comprises a reconstruction filter 170, although this is not required for the invention.

In a preferred embodiment, variable delay module 100 also comprises input port 125 and output port 175. Alternate embodiments can be constructed having a different number of input ports 125 and a different number of output ports 175. For example two input ports can be used to delay the inphase (I) and quadriphase (Q) baseband signals used to represent a communications channel passband. Both signals would be delayed by parallel circuits by the same delay and two output ports would be used to output the delayed I and Q signals."

In a preferred embodiment, an analog signal is used as the input signal, and the output signal is a delayed representation of the input analog signal. In an alternate embodiment, the output signal could be a digital signal, and D/A converter 160 can be omitted. In another alternate embodiment, the input signal could be a digital signal, and A/D converter 120 can be omitted. In additional alternate embodiments, the input signal and the output signal could be digital signals, and A/D converter 120 and D/A converter 160 can be omitted.

Those skilled in the art will recognize that buffering circuit 190, which comprises input FIFO circuit 130, RAM 140, RAM clock circuitry 180, and output FIFO circuit 150, can be implemented in a number of different ways without altering the nature of the present invention. For example, a variety of memory devices could be used with separate input and output clocks and/or strobes. Alternate embodiments can also be constructed in which buffers are included. Buffers could be used to minimize synchronization problems. Alternate embodiments can be constructed using different devices.

In a preferred embodiment, input port 125 is coupled to an input on AID converter 120. A first clock output on clock generator 110 is coupled to a clock input on A/D converter 120. A/D converter 120 outputs are coupled to inputs on input FIFO 130. The first clock output on clock generator 110 is also coupled to a clock input on input FIFO 130.

Input FIFO 130 outputs are coupled to inputs on RAM 140. RAM 140 outputs are coupled to inputs on output FIFO circuit 150. RAM clock 180 is coupled to input FIFO 130, RAM 140, and output FIFO circuit 150.

Output FIFO 150 outputs are coupled to inputs on D/A converter 160. A D/A converter 160 output is coupled to an input on reconstruction filter 170. A second clock output on clock generator 110 is coupled to a clock input on D/A converter 160. The second clock output on clock generator 110 is also coupled to a clock input on output FIFO 150. Output port 175 is coupled to an output on reconstruction filter 170.

In a preferred embodiment, clock generator 110 varies the output sampling rate of output D/A converter 160 relative to the input sampling rate of input A/D converter 120. Variable delay module 100 also uses a linear digital delay buffering circuit to create a continuous delay of an analog signal through the module. Separate clocks are used to control the input and output stages of the delay module (100). The second clock is asynchronous and continuously varying relative to the first clock. The second clock is generated using the coherent difference between the first clock and an autonomously generated reference phase (time) delay.

In a preferred embodiment, clock generator 110 comprises a phase locked loop that is locked to a fixed reference clock. Clock generator 110 maintains a continuous phase relationship between the reference signal and the delay signal. Clock generator 110 adjusts the phase of the local oscillator to provide a variable time delta between the two outputs. Reference output 112 is used to clock data into a remote FIFO (input FIFO circuit 130) and delayed output 114 is used to clock data out of another remote FIFO (output FIFO circuit 150) establishing a controllable delay between input port 125 and output port 175.

The desired delay is loaded into a local FIFO located within clock generator 110. This allows a series of delay values to be loaded in order to obtain dynamic delay characteristics. In addition, clock generator 110 comprises a state machine designed to control the updating of counter values, reading of delay values, and updating the error values.

In addition, clock generator 110 comprises clock reference input 102, at least one control input 104, and a computer bus port 106.

In a preferred embodiment, variable delay module 100 is fabricated on a single Application Specific Integrated Circuit (ASIC), although this is not required for the invention. In alternate embodiments, two or more ASICs could be used. For example, optimizing analog and digital performance parameters, such as speed and power dissipation, can be more easily managed using multiple ASICs.

In a preferred embodiment, variable delay module 100 is fabricated using high-speed Complementary Metal Oxide Semiconductor (CMOS) devices, although this is not required for the invention. In this case, high speed CMOS is used to obtain the packing density required for this complexity. Alternate embodiments, could use other materials such as GaAs.

In an alternate embodiment, a field programmable gate array (FPGA) can be used. In another embodiment, a digital signal processor (DSP) could be used.

In a preferred embodiment, variable delay module 100 is being used in a moderately high frequency application. In this case, variable delay module 100 supports a 1.0 GHz to 2.0 GHz analog signal, although this is not required for the invention. In alternate embodiments, different frequencies can be used. For example, high frequency signals, such as 30 GHz satellite uplink signals, could be down-converted to the needed frequency prior to processing by variable delay module 100. In alternate embodiments, down-converters and/or up-converters can be included with the variable delay module.

Figure 2:
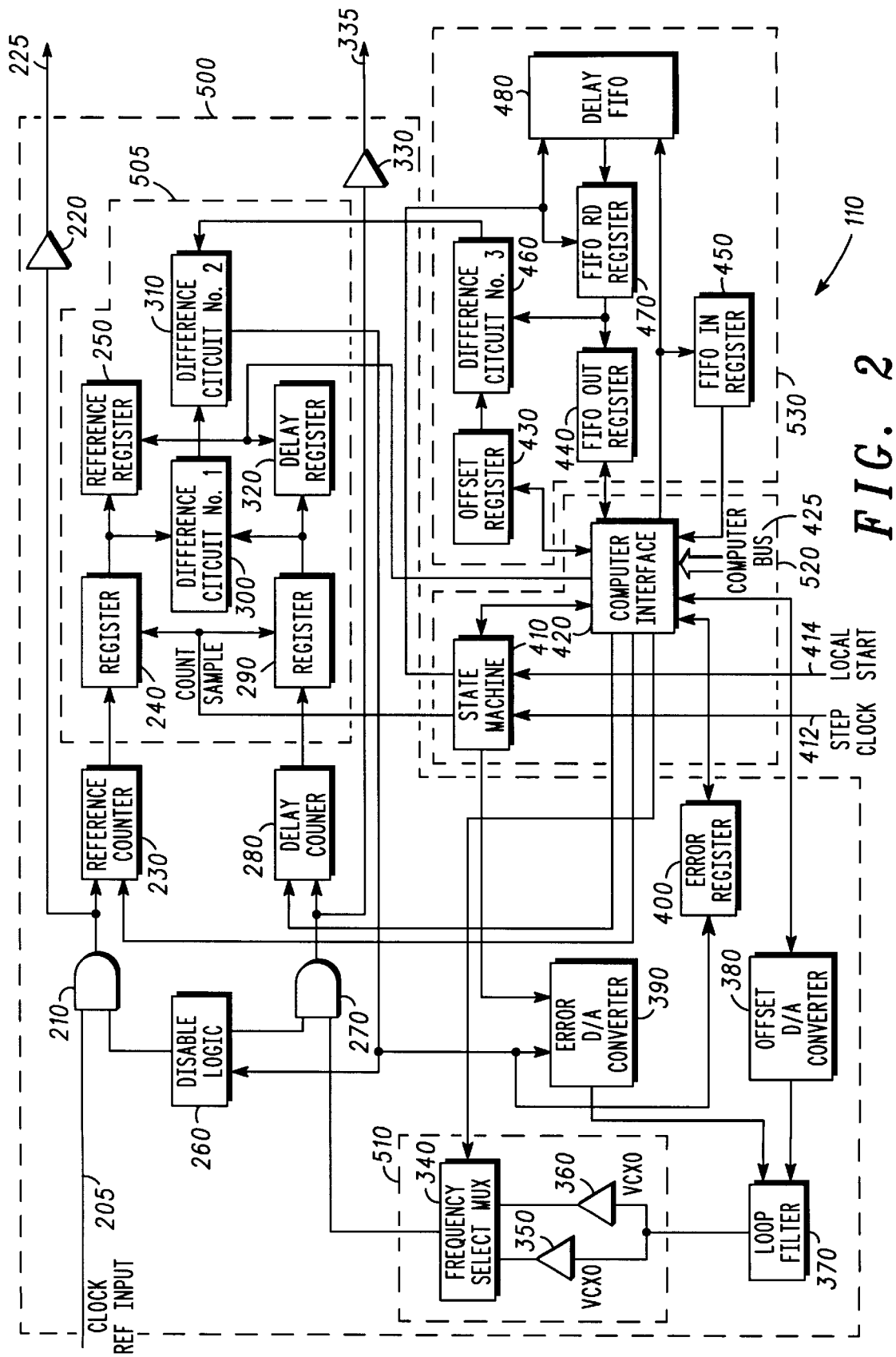
FIG. 2 illustrates a simplified block diagram of a clock generator in accordance with a preferred embodiment of the invention.

FIG. 2 illustrates a simplified block diagram of a clock generator in accordance with a preferred embodiment of the invention. In a preferred embodiment, clock generator 110 comprises DPLL 500, controller 520, and delay control circuit 530. Controller 520 is coupled to DPLL 500 and delay control circuit 530, and DPLL 500 is coupled to delay control circuit 530. In addition, DPLL 500 comprises a number of input and output ports, including clock reference input 102, clock output 225, and delayed clock output 335. Controller 520 also comprises a number of input and output ports, including step clock input 412, local start input 414, and computer bus 425.

In a preferred embodiment, DPLL 500 comprises frequency selector 510, delay error circuit 505, gates 210, 220, 270, and 330, disable logic 260, reference counter 230, delay counter 280, error register 400, error D/A 390, offset D/A 380, and loop filter 370. In an alternate embodiment, loop filter can be implemented digitally and error D/A 390 and offset D/A are not required.

In a preferred embodiment, delay error circuit 505 comprises registers 240, and 290, reference register 250, delay register 320, first difference circuit 300, and second difference circuit 310.

In alternate embodiments, one or more of the registers can be implemented using software and/or firmware. In addition, one or more of the counters can be implemented using software and/or firmware in alternate embodiments. Furthermore, in alternate embodiments one or more of the difference circuits can be implemented using software and/or firmware.

In a preferred embodiment, frequency selector 510 comprises frequency select multiplexer 340, VCXO 350, and VCXO 360. In addition, one or more VCOs could be used in place of or in combination with one or more VCXOs in alternate embodiments. Furthermore, one or more numerically controllable oscillators (NCOs) could also be used in alternate embodiments.

In other alternate embodiments, frequency selector 510 can comprise one or more frequency dividers. In additional alternate embodiments, frequency selector 510 can comprise up-conversion or down-conversion circuitry.

Clock reference input 205 is coupled to one of two inputs on gate 210. In an alternate embodiment, gate 210 can have one or more inputs. For example, additional inputs can be used to allow additional reference signals to be used. Disable logic circuit 260 is also coupled to one of the inputs on gate 210. Disable logic circuit 260 provides for the progression of large delay steps.

The output of gate 210 is coupled to an input of reference counter 230 and to an input of gate 220. In a preferred embodiment, gate 220 is a driver circuit. In this manner, a gated reference signal drives reference counter 230.

As illustrated in FIG. 2, the output of gate 220 is coupled to clock output 225. Although illustrated as a single line, clock output 225 can comprise one or more lines depending on the design requirements.

A second input of reference counter 230 is coupled to an output of computer interface 420. Computer interface 420 provides a means for starting, stopping, and resetting clock generator 110. An output of reference counter 230 is coupled to an input of register 240.

Reference counter 230 and delay counter 280 comprise continuous circular counter that are designed to account for the maximum number of clocks cycles required to support the delay required.

Register 240 and register 290 provide a sample at a given time indicating the number of clock cycles elapsed in register 240 and register 290 at the update interval.

Reference register 250 is used to store a delay value that is to be monitored by controller 520.

In FIG. 2, disable logic circuit 260 is also coupled to one of the inputs on gate 270. In an alternate embodiment, gate 270 can have one or more inputs. For example, additional inputs can be used to allow additional local oscillator signals to be used.

An output of gate 270 is coupled to an input of delay counter 280, and this allows a gated feedback signal to drive delay counter 280. The output of gate 270 is also coupled to an input of gate 330. In a preferred embodiment, gate 330 is a driver circuit.

As illustrated in FIG. 2, the output of gate 330 is coupled to delayed clock output 335. Although illustrated as a single line, delayed clock output 335 can comprise one or more lines depending on the design requirements.

A second input of delay counter 280 is coupled to an output of computer interface 420. Controller 520 is used to start, stop, and/or initialize delay counter 280. An output of delay counter 280 is coupled to an input of register 290.

Delay counter 280 is a continuous circular counter that is used to count elapsed delay clock cycles. Register 290 is used to capture and/or store the delay count at the update interval.

Delay register provides a sampled value to be read by the computer for monitoring purposes.

In a preferred embodiment, the reference input drives one counter and the delayed signal drives a second counter. The difference between the counter values establishes a time difference measured between the two counters. That measurement is then compared to the desired value read from the FIFO after it has been adjusted for path-length compensation. The result is then the error signal sent to the error D/A.

Register 240 is coupled to reference register 250 and first difference circuit 300. Register 290 is coupled to delay register 320 and first difference circuit 300. The output of reference counter 230 and the output of delay counter 280 are compared at regular intervals established by state machine 410.

The arithmetic counter difference is calculated by first difference circuit 300 to determine the actual difference in phase between the reference signal and the local oscillator signal.

An output of first difference circuit 300 is coupled to an input of second difference circuit 310. An output of third difference circuit 460 is also coupled to an input of second difference circuit 310. The counter difference is compared to the desired delay by second difference circuit 310, and in this way, a digital error signal is generated. The output of second difference circuit 310 is coupled to disable logic circuit 260, to error D/A 390, and error register 400.

Another input of error D/A 390 is coupled to state machine 410. State machine 410 determines the update rate of error D/A 390 relative to the step clock established at step clock input 412.

An output of error D/A 390 is coupled to an input of loop filter 370. In addition, an output of offset D/A 380 is coupled to an input of loop filter 370.

Computer interface 420 is coupled to offset D/A 380. This allows a computer that is connected via computer bus 425 to exchange data with offset D/A 380. For example, the offset D/A value is pre-set via computer interface 420 and offset D/A 380 is used to adjust loop biases.

The error D/A voltage drives one side of loop filter 370 with the other side driven from offset D/A 380. Offset D/A 380 is controlled directly from computer interface 420 and is used for oscillator/filter compensation and calibration. Loop filter 370 provides the loop gain and loop filter function of the circuit setting the maximum slew rate of the loop and the acquisition characteristics. Clock generator 110 comprises reference and delayed signal disable circuitry used to speed up acquisition for delay deltas beyond the slew rate of the loop. A clock enable/disable signal provided by clock generator 110 is used to disable either clock and this allows the delay to increase rapidly.

In a preferred embodiment, the output of loop filter 370 is coupled to VCXO 350 and VCXO 360, although this is not required for the invention. Those skilled in the art will recognize that loop filter 370 could be coupled to one or more VCXOs in frequency selector. In this embodiment, the resulting signal drives both VCXOs adjusting the delayed output appropriately. In addition, VCXO 350 operates over a first frequency range and VCXO 360 operates over a second frequency range.

The output of VCXO 350 and the output of VCXO 360 are coupled to frequency select multiplexer 340. Frequency select multiplexer 340 is also coupled to computer interface 420. The desired VCXO is selected by frequency select multiplexer 340 using a signal from computer interface 420. The output of frequency select multiplexer 340 is coupled to an input of gate 270.

In a preferred embodiment, controller 520 comprises state machine 410, and computer interface 420. In an alternate embodiment, controller 520 can comprise a microprocessor or other computing device.

As illustrated in FIG. 2, computer bus 425 is coupled to computer interface 420. Computer interface 420 is coupled to error register 400. This allows a computer or other processing device that is connected via computer bus 425 to exchange data with error register 400. For example, error register 400 can be monitored by controller 520, and this allows the error to be determined at one or more sample points in time.

Computer interface 420 is coupled to state machine 410. This allows a computer or other processing device that is connected via computer bus 425 to exchange data with state machine 410. For example, this allows the computer to control some of the operation of state machine 410.

Computer interface 420 is coupled to offset register 430. This allows a computer that is connected via computer bus 425 to exchange data with offset register 430. For example, the fixed delay adjustment is stored in offset register 430 through computer interface 420.

Offset register 430 is also coupled to third difference circuit 460. Offset register 430 provides the fixed delay adjustment to third difference circuit 460.

Computer interface 420 is coupled to FIFO out register 440. This allows a computer or other processing device that is connected via computer bus 425 to exchange data with FIFO out register 440. For example, a read operation can be performed in which the computer is able to monitor the value read from the FIFO at various times during the operation of variable delay module 100 (FIG. 1).

Computer interface 420 is coupled to FIFO in register 450. This allows a computer or other processing device that is connected via computer bus 425 to exchange data with FIFO in register 450. For example, a write operation can be performed in which the computer is able to monitor the value loaded into the FIFO at various times during the operation of variable delay module 100 (FIG. 1).

Computer interface 420 is coupled to delay FIFO 480. This allows a computer that is connected via computer bus 425 to exchange data with delay FIFO 480. For example, the computer monitors and controls the FIFO fill status to determine when the FIFO is filled, when the FIFO is full, and when the FIFO is partially full.

Delay FIFO 480 is also coupled to FIFO read register 470. The desired delay is loaded and stored in delay FIFO 480 through computer interface 420. Delay FIFO 480 allows a series of delay values to be loaded and stored in order to obtain dynamic delay characteristics. The desired delay is then read from delay FIFO 480 into FIFO read register 470.

FIFO read register 470 is also coupled to FIFO out register 440 and third difference circuit 460. The desired delay is then adjusted by a preset offset constant in third difference circuit 460.

Also illustrated in FIG. 2, state machine 410 is coupled to step clock input 412 and local start input 414. Step clock input 412 provides the timing used for updating the loop (i.e., fixed clock is used to determine when to read delay FIFO 480). Start clock input 414 provides an external synchronization input to initiate the delay loop processing.

State machine 410 is coupled to register 240 and register 290. State machine 410 provides internal synchronization for variable delay module 100 providing a count sample signal to register 240 and register 290. The internal synchronization is synchronous with the step clock signal obtained at step clock input 412.

State machine 410 is coupled to delay FIFO 480. State machine 410 provides internal synchronization to delay FIFO 480. The internal synchronization ensures that the loading and processing in delay FIFO 480 is synchronous with the step clock signal obtained at step clock input 412 (i.e., enable and disable signal are synchronously controlled).

State machine 410 is coupled to FIFO read register 470. State machine 410 provides internal synchronization to FIFO read register 470. The internal synchronization ensures that the loading and reading of FIFO read register 470 is also synchronous with the step clock signal.

State machine 410 controls the updating of counter values, the reading of delay values from delay FIFO 480, and updating the error value to the A/D's.

Clock generator 110 (FIG. 1) also contains reference and delayed signal disable circuitry used to speed up acquisition for delay deltas beyond the slew rate of the loop.

In one application, the variable delay module is used in a piece of test equipment that emulates the Doppler and propagation delay for a satellite to ground station path. In addition, the test equipment is used to simulate the Doppler and propagation delay associated with subscriber links in satellite communication systems.

The invention includes the process of sampling the input A/D of the digital delay circuitry and the output D/A of the delay circuitry at a continuously varying different frequency to create a continuously varying delay. In an alternate embodiment, the present invention can be used to create continuously varying frequency sources.

In summary, a variable delay module has been described. The invention has been described above with reference to a preferred embodiment. However, those skilled in the art will recognize that changes and modifications can be made in this preferred embodiment without departing from the scope of the invention. For example, the block diagram identified herein can be organized differently than described herein while achieving equivalent results. In addition, the number of functional blocks could be different from that described in the preferred embodiment. These and other changes and modifications, which are obvious to those skilled in the art, are intended to be included within the scope of the invention.

What is claimed is:

1. A variable delay module comprising:
    a clock generator having a clock reference input, a plurality of control line inputs, a computer bus port, a first clock output, and a second clock output;
    an input means having an input, a digital output, and a clock input coupled to said first clock output for controlling timing of said digital output;
    a buffering circuit having an digital input coupled to said digital output of said input means and a digital output, said buffering circuit having a first clock input coupled to said first clock output and a second clock input coupled to said second clock output; and
    an output means having a digital input coupled to said digital output of said buffering circuit, an output, and a clock input coupled to said second clock output for controlling timing of said output, wherein said clock generator further comprises:
        a digital phase lock loop (DPLL) coupled to said clock reference input, coupled to said first clock output, and coupled to said second clock output;
        a controller coupled to said DPLL coupled to said plurality of control inputs, and said computer bus port; and
        a delay control circuit coupled to said DPLL and to said controller.

2. The variable delay module as claimed in claim 1, wherein said input means further comprises:
    an analog-to-digital (A/D) converter.

3. The variable delay module as claimed in claim 1, wherein said output means further comprises:
    a digital-to-analog (D/A) converter.

4. The variable delay module as claimed in claim 1, wherein said buffering circuit further comprises:
    an input first-in-first-out (FIFO) circuit coupled to said digital output and to said first clock input;
    a memory means coupled to said input FIFO; and
    an output FIFO coupled to said memory means, coupled to said second clock input, and coupled to said digital output.

5. The variable delay module as claimed in claim 1, wherein said memory means further comprises:
    a random access memory (RAM); and
    a RAM clock coupled to said RAM, to said input FIFO, and to said output FIFO.

6. The variable delay module as claimed in claim 1, wherein said variable delay module further comprises a reconstruction filter coupled to said output of said output means.

7. The variable delay module as claimed in claim 1, wherein said DPLL further comprises:
    a first gate having one input coupled to said clock reference input;
    a disable logic circuit coupled to a second input of said first gate;
    a reference counter coupled to an output of said first gate;
    a second gate having an input coupled to an output of said first gate and an output coupled to said first clock output, wherein said second gate comprises a driver circuit;
    a third gate having one input coupled to said disable logic circuit;
    a delay counter coupled to an output of said third gate;
    a fourth gate having an input coupled to an output of said third gate and an output coupled to said second clock output, wherein said second gate comprises a driver circuit;
    a delay error circuit coupled to said reference counter, to said delay counter, to said disable logic circuit, to said controller, and to said delay control circuit;

an error D/A coupled to said delay error circuit, coupled to said disable logic circuit, and coupled to said controller;

an offset D/A coupled to said controller;

a loop filter coupled to said error D/A and coupled to said offset D/A; and a frequency selector coupled to said loop filter, coupled to said controller, and coupled to said third gate.

8. The variable delay module as claimed in claim 7, wherein said frequency selector comprises a voltage-controlled crystal oscillator (VCXO).

9. The variable delay module as claimed in claim 7, wherein said frequency selector comprises a voltage-controlled oscillator (VCO).

10. The variable delay module as claimed in claim 7, wherein said frequency selector comprises a numerically controlled oscillator (NCO).

11. The variable delay module as claimed in claim 7, wherein said frequency selector comprises a frequency divider.

12. The variable delay module as claimed in claim 7, wherein said frequency selector comprises a down-converter.

13. The variable delay module as claimed in claim 7, wherein said frequency selector comprises an up-converter.

14. The variable delay module as claimed in claim 7, wherein said delay error circuit comprises:

a first register coupled to said reference counter and to said controller;

a second register coupled to said delay counter and to said controller;

a first difference circuit coupled to said first register and coupled to said second register;

a second difference circuit coupled to said first difference circuit, to said disable logic circuit, to said controller, and to said delay control circuit;

a reference register coupled to said first register and to said first difference circuit; and a delay register coupled to said second register, to said first difference circuit, and to said reference register.

15. The variable delay module as claimed in claim 7, wherein said delay control circuit further comprises:

a delay FIFO coupled to said controller;

a FIFO read register coupled to said delay FIFO and to said controller;

a FIFO input register coupled to said delay FIFO and to said controller;

a FIFO output register coupled to said controller;

an offset register coupled to said controller; and a third difference circuit coupled to said offset register, coupled to said FIFO read register coupled to said FIFO output register, and coupled to said delay control circuit.

16. The variable delay module as claimed in claim 7, wherein said controller further comprises:

a state machine; and a computer interface coupled to said state machine and to said computer bus port.

17. The variable delay module as claimed in claim 7, wherein said controller further comprises a microprocessor coupled to said computer bus port.

18. The variable delay module as claimed in claim 1, wherein said variable delay module further comprises a down-converter coupled to said input means.

19. The variable delay module as claimed in claim 1, wherein said variable delay module further comprises an up-converter coupled to said output means.

* * * * *